(12) United States Patent
Lee et al.

(10) Patent No.: US 6,885,609 B2
(45) Date of Patent: Apr. 26, 2005

(54) SEMICONDUCTOR MEMORY DEVICE SUPPORTING TWO DATA PORTS

(75) Inventors: Tae-jung Lee, Kyungki-Do (KR); Byung-sun Kim, Suwon (KR); Joon-hyung Lee, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/724,687

(22) Filed: Dec. 2, 2003

(65) Prior Publication Data

US 2004/0120209 A1 Jun. 24, 2004

(30) Foreign Application Priority Data

Dec. 18, 2002 (KR) .............................. 10-2002-0081393

(51) Int. Cl.[7] .............................. G11C 8/00; G11C 11/00
(52) U.S. Cl. .................................. 365/230.05; 365/154
(58) Field of Search ........................... 365/230.05, 154, 365/156, 51, 63

(56) References Cited

U.S. PATENT DOCUMENTS 5,754,468 A * 5/1998 Hobson ..................... 365/156
6,341,083 B1 * 1/2002 Wong ......................... 365/154
6,347,062 B2    2/2002 Nii et al.
6,590,802 B2 * 7/2003 Nii .............................. 365/156

FOREIGN PATENT DOCUMENTS

JP        10-178110        7/1999

* cited by examiner

Primary Examiner—Anh Phung
(74) Attorney, Agent, or Firm—Volentine, Francos & Whitt, PLLC

(57) ABSTRACT

A layout of a memory cell of a dual-port semiconductor memory device provides for one memory cell that includes a total of eight transistors, including two NMOS scan transistors. Among the transistors, two PMOS transistors and six NMOS transistors are disposed in one N-well area and one contiguous P-well area of a semiconductor substrate, respectively. The N-well area is disposed at a corner of the memory cell for improving efficiency of the layout. Since one N-well area and one P-well area are formed in the semiconductor substrate, the size of an isolated area between the N-well area and the P-well area can be reduced, thus also reducing the size of a memory cell.

20 Claims, 11 Drawing Sheets

SEMICONDUCTOR MEMORY DEVICE SUPPORTING TWO DATA PORTS

CROSS REFERENCES TO RELATED APPLICATIONS

This application claims the priority under 35 U.S.C. §119 from Korean Patent Application No. 2002-81393, filed on Dec. 18, 2002, the contents of which are hereby incorporated by reference in their entirety for all purposes as if fully set forth herein.

BACKGROUND AND SUMMARY

1. Technical Field

The present invention relates to a semiconductor memory device, and more particularly, to a memory cell layout of a static random access memory (SRAM) within a semiconductor memory device that supports two data ports.

2. Description

Semiconductor memory devices can be classified as dynamic random access memories (DRAMs) and static random access memories (SRAMs) based on the memory system. SRAMs have the advantages of high speed, low power consumption, and simpler operation. In addition, an SRAM does not require periodically refreshing information that is stored and is compatible with the manufacturing process of a logic semiconductor device. Thus, the SRAM has been widely used in embedded memory devices.

A memory cell of an SRAM includes two drive transistors or pull-down transistors, two load modules, and two pass transistors or access transistors. SRAMs can be classified as CMOS SRAMs, high load resistor (HLR) SRAMs, or thin film transistor (TFT) SRAMs, based on the type of the load module. A CMOS SRAM uses a P-channel type field effect (PMOS) transistor as the load module, an HLR SRAM uses a high load resistor as the load module, and a TFT SRAM uses a polysilicon thin film transistor as the load module.

Thus, a memory cell of a CMOS SRAM has a total six of transistors, including two PMOS transistors that are used as the load module. In general, among the six transistors, four transistors are N-channel type field effect (NMOS) transistors; two driving NMOS transistors and the two PMOS transistor constitute two inverters, and the remaining two NMOS transistors are pass transistors.

There are many factors which restrict the operating speed of the CMOS SRAM. For example, the operating speed of the CMOS SRAM is affected by resistance related characteristics of SRAM wiring lines, the magnitude of parasitic capacitance occurring between bit lines and complementary bit lines adjacent to the bit lines, the number of ports serving as paths for reading and writing data, and the like.

In general, a CMOS SRAM with six transistors supports a single port. That is, a pair composed of a bit line and a complementary bit line is connected to a node through two pass transistors, the node corresponding to memory that includes two inverters. For example, Japanese Patent Publication No. Hei 10-178110 discloses an equivalent circuit of a single port SRAM having six transistors and a memory cell layout that includes the equivalent circuit.

The single port SRAM uses the pair of the bit line and the complementary bit line (hereinafter, referred to as a pair of bit lines) as an input/output node. Thus, the single port SRAM cannot input and output data at the same time. Therefore, the extent to which operating speed can be improved in the single-port SRAM is limited.

In order to improve the operating speed of a CMOS SRAM, a multi-port CMOS SRAM has been suggested. A multi-port CMOS SDRAM includes a plurality of input nodes and/or output nodes. In general, more than seven transistors are included in a memory cell of multi-port COMS SRAM. However, more than ten transistors may be included under certain conditions.

A multi-port CMOS SRAM can simultaneously read and write data through both ports, i.e., the input port and the output port. While data is read from a memory cell in the single port CMOS SRAM, data cannot be written to another memory cell if the memory cells are connected to the same pair of bit lines. Thus a delay time occurs between data write and read operations. In contrast to the single port CMOS SRAM, a multi-port CMOS SRAM can read data from a memory cell while writing data to another memory cell, even if the memory cells are connected to the same pair of bit lines. Thus, a delay does not occur between a data write operation and a data read operation.

In order to achieve higher speeds of operation than achieved in the past in a multi-port CMOS SRAM, various proposals of equivalent circuits and arrangements of devices constituting the equivalent circuits have been suggested. Typically, each device is arranged to adapt to a system's required performance. As described above, since an SRAM consumes little power and operates at a high speed, each device is arranged such that both of these two characteristics, i.e. low power consumption and high operating speed, are achieved, or one of the two characteristics is fully achieved.

U.S. Pat. No. 6,347,062 discloses a diagram of an equivalent circuit of a memory cell of multi-port CMOS SRAM and a layout of a memory cell of a multi-port CMOS SRAM. FIGS. 1 and 2 respectively show the diagram of the equivalent circuit and the diagram of the layout according to U.S. Pat. No. 6,347,062. The equivalent circuit of FIG. 1 corresponds to a CMOS SRAM that supports two ports. Reference numerals presented in FIGS. 1 and 2 represent the same as those disclosed in U.S. Pat. No. 6,347,062.

Referring to the SRAM supporting two ports (dual port SRAM) in FIG. 1 according to the prior art, a first P-channel type MOS transistor P1 and a first N-channel type MOS transistor N1 constitute a first CMOS inverter. A second PMOS transistor P2 and a second NMOS transistor N2 constitute a second CMOS inverter. Input nodes and output nodes of these CMOS inverters are cross connected at a first memory node MA and a second memory node MB. Thus these CMOS inverters constitute a flip-flop circuit.

A third NMOS transistor N3 and a fourth NMOS transistor N4 are pass transistors that function as access transistors. Gates of the pass transistors N3 and N4 are connected to a first word line WWL. Source regions and drain regions of the pass transistor N3 and N4 are connected to the memory nodes MA and MB, respectively, and a pair of first bit lines WBL1 and WBL2.

A fifth NMOS transistor N8 and a sixth NMOS transistor N9 are scan transistors. The scan transistors N8 and N9, along with a second bit line RBL and a second word line RWL, which are connected to the scan transistors N8 and N9, function as a second output port. The fifth NMOS transistor N8 has a gate connected to the first memory node MA, a source region connected to a ground voltage, and a drain region connected to the source region of the sixth NMOS transistor N9. The sixth NMOS transistor N9 has a gate connected to a second word line RWL, and a drain region connected to a second bit line RBL.

According to the equivalent circuit described, it is possible to read and write data through the first port using the first word line WWL and the pair of first bit lines WBL1 and WBL2. In addition, it is possible to read data through the second port using the second word line RWL and the second bit line RBL. In particular, regardless of whether the first port operates or not, it is possible to separately read data through the second port.

The layout of the memory cell having the equivalent circuit of FIG. 1 can be represented in various ways. The performance of a semiconductor memory device can also vary with respect to the layout of the memory cell. FIG. 2 shows a layer of a multi-layered layout of the dual-port SRAM of FIG. 1.

As shown in the dual-port SRAM of FIG. 2 according to the prior art, each unit memory cell is formed on a semiconductor substrate. Each unit memory cell can include an N-well area NW and two P-well areas, i.e., a first P-well area PW1 and a second P-well area PW2, which are disposed separately on the two sides of the N-well area NW. That is, the first PMOS transistor P1 and the second PMOS transistor P2 can be formed in the N-well area NW. The first NMOS transistor N1 and the third NMOS transistor N3 are formed in the first P-well area PW1. The second NMOS transistor N2, the fourth NMOS transistor N4, the fifth NMOS transistor N8, and the sixth NMOS transistor N9 are formed in the second P-well area PW2.

According to such a layout, it is possible to form the pair of first bit lines WBL1 and WBL2, and the second bit line RBL in parallel to the boundary between the N-well area NW and the first P-well area PW1 and the boundary between the N-well area NW and the second P-well area PW2.

Therefore, according to prior art, it is possible to manufacture an SRAM with higher speeds of operation by shortening the first lines WBL1 and WBL2, and the second bit line RBL.

However, in such a layout, since two P-well areas PW1 and PW2 are disposed separately on the two sides of the N-well area NW, boundaries between well areas become long. As a result, an isolation area is formed on the boundaries to separate the wells from one another, thus occupying a large amount of area and increasing the area per unit memory cell.

Accordingly, it would be desirable to provide a semiconductor memory device which is capable of simultaneously reading and writing data through two ports, and consists of a reduced isolation area that is formed on a boundary by producing a layout of memory cell elements with more effective wiring and reducing the boundary between an N-well area and a P-well area.

It would also be desirable to provide a semiconductor memory device achieving superior performance by removing unnecessary wiring elements and effectively arranging wiring lines.

According to one aspect of the present invention, there is provided a dual-port semiconductor memory device comprising a semiconductor substrate, which includes a memory cell having one N-well area where a p+-type active region is formed and one contiguous P-well area where an n+-type active region is formed, a first word line, a second word line (scan address line), a first bit line, a first complementary bit line, a second bit line (scan data out line), a first CMOS inverter, which includes a first NMOS transistor, a first PMOS transistor, an input terminal, and an output terminal, a second CMOS inverter, which includes a second NMOS transistor, a second PMOS transistor, an input terminal, and an output terminal, wherein the input terminal of the second CMOS inverter is connected to the output terminal of the first CMOS inverter to form a first memory node and the output terminal of the second CMOS inverter is connected to the input terminal of the first CMOS inverter to form a second memory node, a third NMOS transistor, which has a gate connected to the first word line, a drain connected to the first bit line, and a source connected to the first memory node, a fourth NMOS transistor, which has a gate connected to the first word line, a drain connected to the first complementary bit line, and a source connected to the second memory node, a fifth NMOS transistor, which has a gate connected to the first memory node and a source connected to a ground line, and a sixth NMOS transistor, which has a gate connected to the second word line, a source connected to the drain of the fifth NMOS transistor, and a drain connected to the second bit line. The first PMOS transistor and the second PMOS transistor are disposed in the p+-type active region of the N-well area; and the first NMOS transistor, the second NMOS transistor, the third NMOS transistor, the fourth NMOS transistor, the fifth NMOS transistor, and the sixth NMOS transistor are formed in the n+-type active region of the contiguous P-well area.

According to another aspect of the present invention, there is provided a dual-port semiconductor memory device comprising a semiconductor substrate, which includes a memory cell having one N-well area where a p+-type active region is formed and one contiguous P-well area where an n+-type active region is formed, a first word line, a second word line (scan address line), a first bit line, a first complementary bit line, a second bit line (scan data out line), a first CMOS inverter, which includes a first NMOS transistor, a first PMOS transistor, an input terminal, and an output terminal, a second CMOS inverter, which includes a second NMOS transistor, a second PMOS transistor, an input terminal, and an output terminal, wherein the input terminal of the second CMOS inverter is connected to the output terminal of the first CMOS inverter to form a first memory node and the output terminal of the second CMOS inverter is connected to the input terminal of the first CMOS inverter to form a second memory node, a third NMOS transistor, which has a gate connected to the first word line, a drain connected to the first bit line, and a source connected to the first memory node, a fourth NMOS transistor, which has a gate connected to the first word line, a drain connected to the first complementary bit line, and a source connected to the second memory node, and a fifth NMOS transistor, which has a gate connected to the second word line, a source connected to the first memory node, and a drain connected to the second bit line. The first PMOS transistor and the second PMOS transistor are disposed in the p+-type active region of the N-well area; and the first NMOS transistor, the second NMOS transistor, the third NMOS transistor, the fourth NMOS transistor, and the fifth NMOS transistor are formed in the n+-type active region of the contiguous P-well area.

Beneficially, the N-well area is disposed at a corner of the memory cell, and the contiguous P-well area is disposed in a remaining portion of the memory cell.

Beneficially, a plurality of N-well areas constitute a separate N-well area, which is surrounded by the contiguous P-well area, and the dual-port semiconductor memory device further comprises a well contact used to connect the one separate N-well area with a power source of the semiconductor memory device.

Beneficially, a second n+-type active region, which is connected to the well contact, is further formed in the p+-type active region of the separate N-well area, and a silicide layer is formed in the second n+-type active region and the p+-type active region to connect the second n+-type active region and the p+-type active region to each other. It is beneficial that the one separate N-well area is shared by four memory cells.

Beneficially, the n+-type active region and the well contact in the p+-type active region are shared by two memory cells adjacent to each other.

Beneficially, an N-well bridge is further formed in the contiguous P-well area to connect the N-well areas of the memory cells adjacent to each other. Beneficially, a width of the N-well bridge is 10% to 50% of a width of the N-well area.

Beneficially, the second word line is parallel to the first word line.

Beneficially, the second bit line is parallel to the first bit line.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
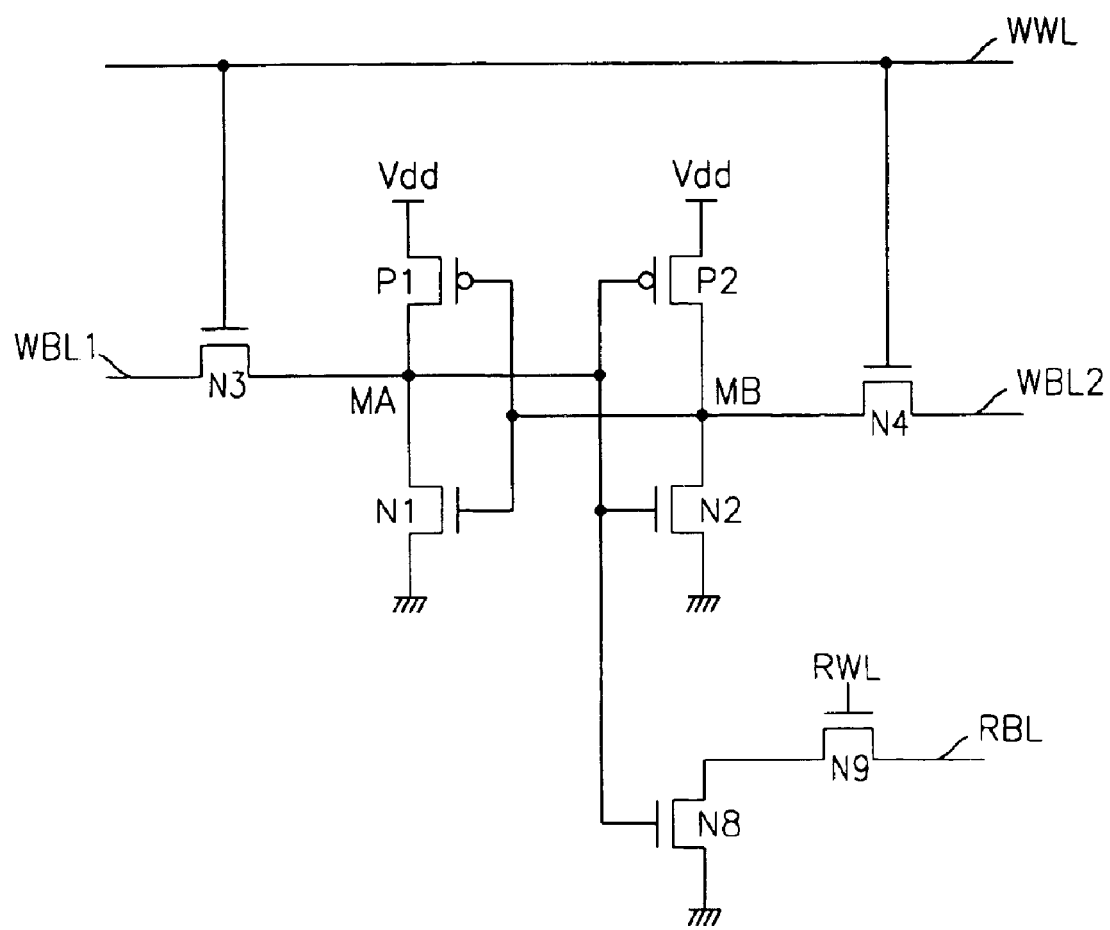
FIG. 1 is a diagram showing an equivalent circuit of a memory cell of a dual-port semiconductor memory device according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It is also noted that like reference numerals may be used to designate identical or corresponding parts throughout the several views.

Figure 3:
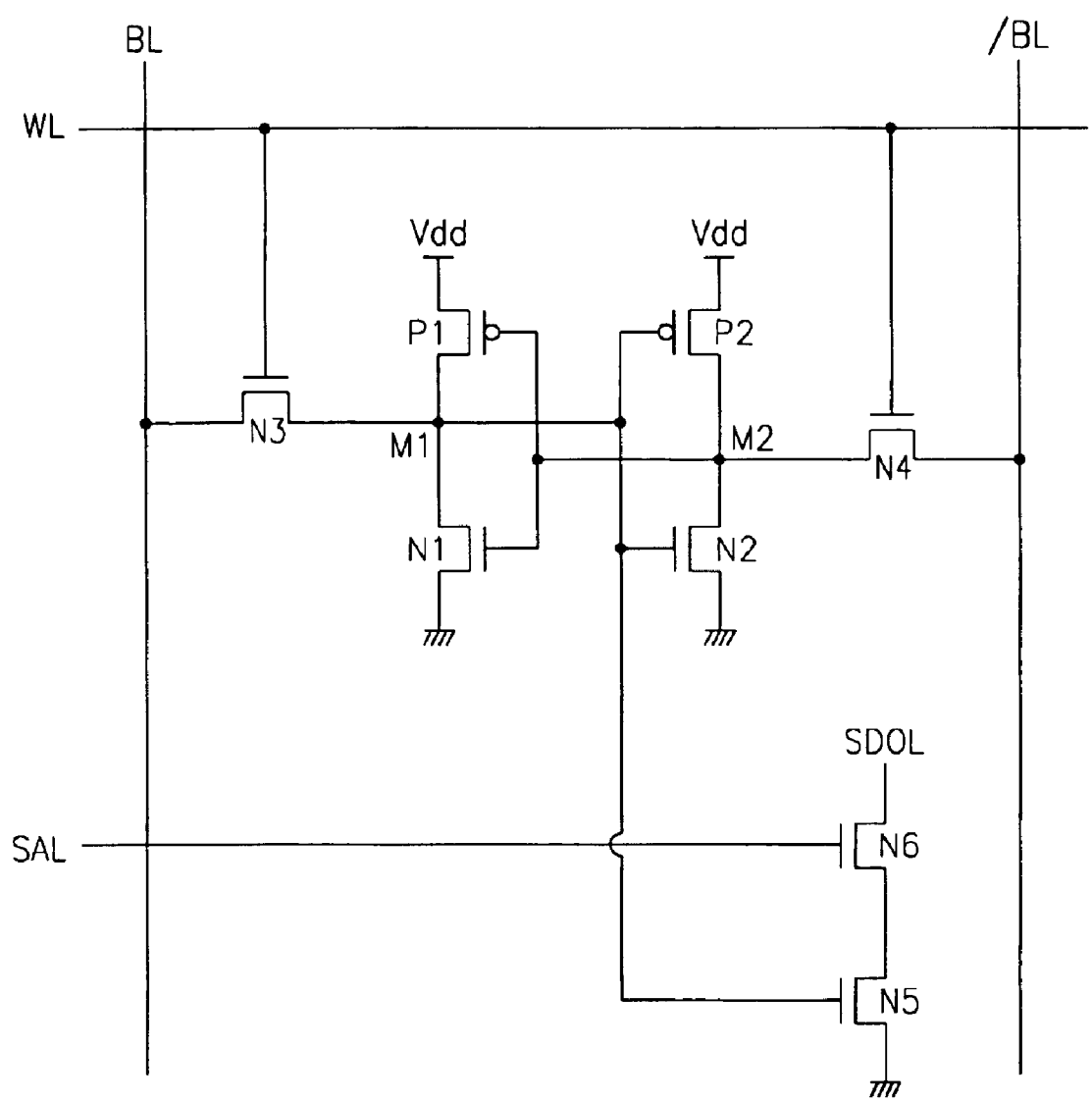
FIG. 3 is a diagram showing an equivalent circuit of a memory cell of a dual-port semiconductor memory device according to a first embodiment.

FIG. 3 shows an equivalent circuit of a memory cell of a dual-port semiconductor memory device. The equivalent circuit of FIG. 3 is identical to the equivalent circuit shown in FIG. 1, however it is presented again as a reference for reviewing the equivalent circuit in more detail. The reference numerals of FIG. 3 are different from those in FIG. 1.

Referring to FIG. 3, a first PMOS transistor P1 and a first NMOS transistor N1 constitute a first CMOS inverter. A second PMOS transistor P2 and a second NMOS, transistor N2 constitute a second CMOS inverter. Input terminals and output terminals of these CMOS inverters are cross connected, thus the four MOS transistors P1, P2, N1, and N2 form a flip-flop circuit. Data is stored in a first memory node M1, which functions as an output terminal of the first CMOS inverter and an input terminal of the second CMOS inverter, and in a second memory node M2, which functions as an output terminal of the second CMOS inverter and an input terminal of the first CMOS inverter.

A third NMOS transistor N3 and a fourth NMOS transistor N4 are pass transistors. That is, they function as access transistors of the first memory node N1 and the second memory node N2, respectively. The third NMOS transistor N3 has a gate connected to a first word line WL, a source region connected to the first memory node M1, and a drain region connected to a first bit line BL. The fourth NMOS transistor N4 has a gate connected to the first word line WL, a source region connected to the second memory node N2, and a drain region connected to a first complementary bit line/BL.

The fifth NMOS transistor N5 and the sixth NMOS transistor N6 are added to the single-port SRAM to form a dual-port SRAM. Thus, according to the equivalent circuit shown in FIG. 3, it is possible to read data stored in the first memory node M1 by operating the fifth NMOS transistor N5 and the sixth NMOS transistor N6.

The fifth NMOS transistor N5 has a gate connected to the first memory node M1, a source region connected to a ground line, and a drain region connected to the source region of the sixth NMOS transistor N6. The sixth NMOS transistor N6 has a gate connected to a second word line, that is, a scan address line SAL, and a drain region connected to a second bit line, that is, or a scan data out line SDOL.

According to such a configuration of the equivalent circuit, it is possible to read from or write to the first memory node M1 or the second memory node M2 using the first word line WL, the first bit line BL, and the first complementary bit line /BL. Thus, the first word line WL, the first bit line BL, and the first complementary bit line/BL function as a first port. Data can also be read using the scan address line SAL, the scan data out line SDOL. Thus, the scan address line SAL or the scan data out line SDOL functions as a second port. In particular, a memory device having the equivalent circuit can separately read data through the second port regardless of the first port, and such data read operations do not have influence on the status of the first memory node M1 and the second memory node M2.

Figure 2:
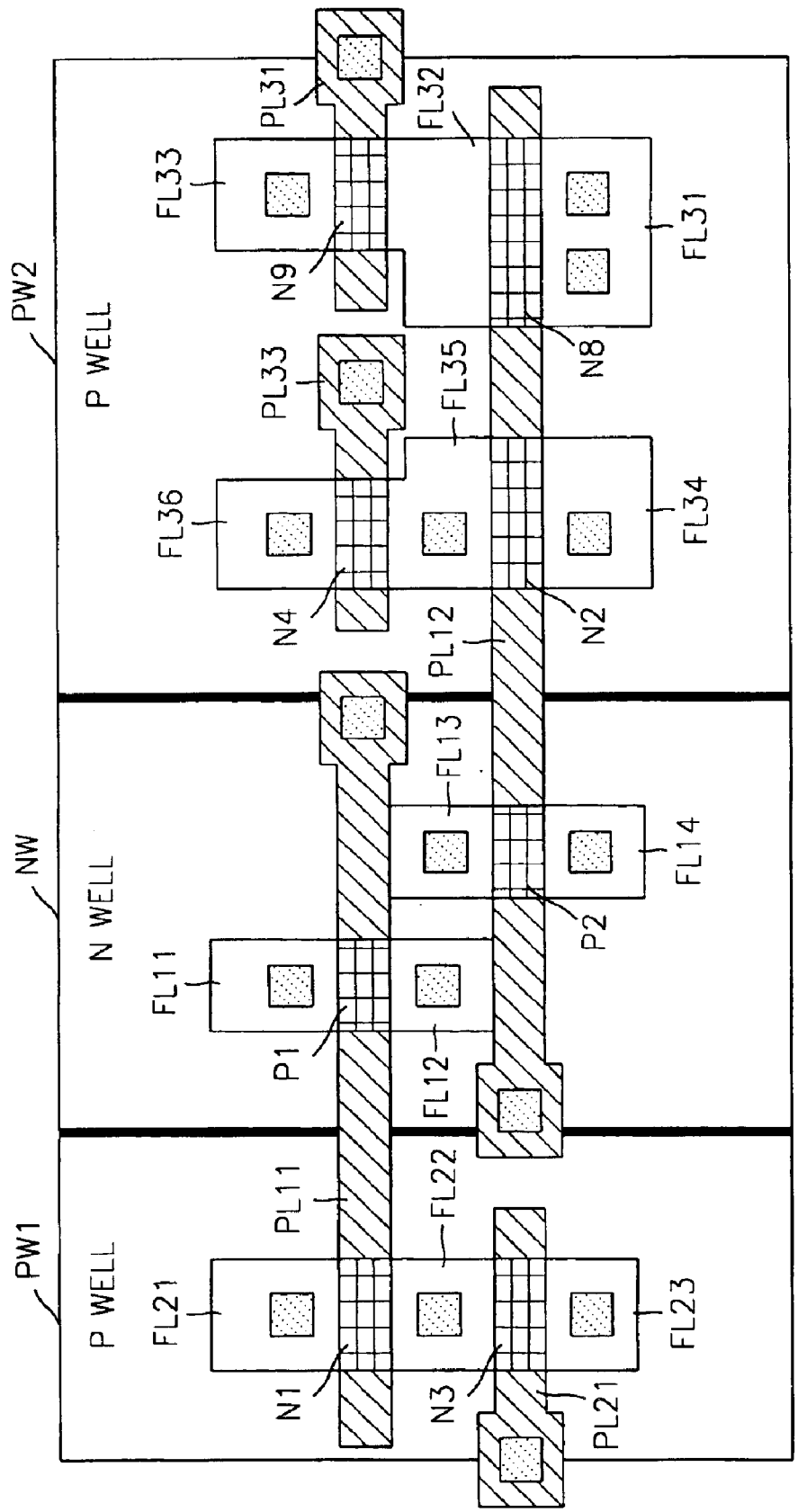
FIG. 2 is a diagram showing a layout of a memory cell of a dual-port semiconductor memory device according to the prior art.

The previously described equivalent circuit has been widely used so far. However, FIGS. 4 through 10 show layouts of a semiconductor memory device, corresponding to the equivalent circuit of FIG. 3, that differ from the prior art layout shown in FIG. 2.

Figure 4:
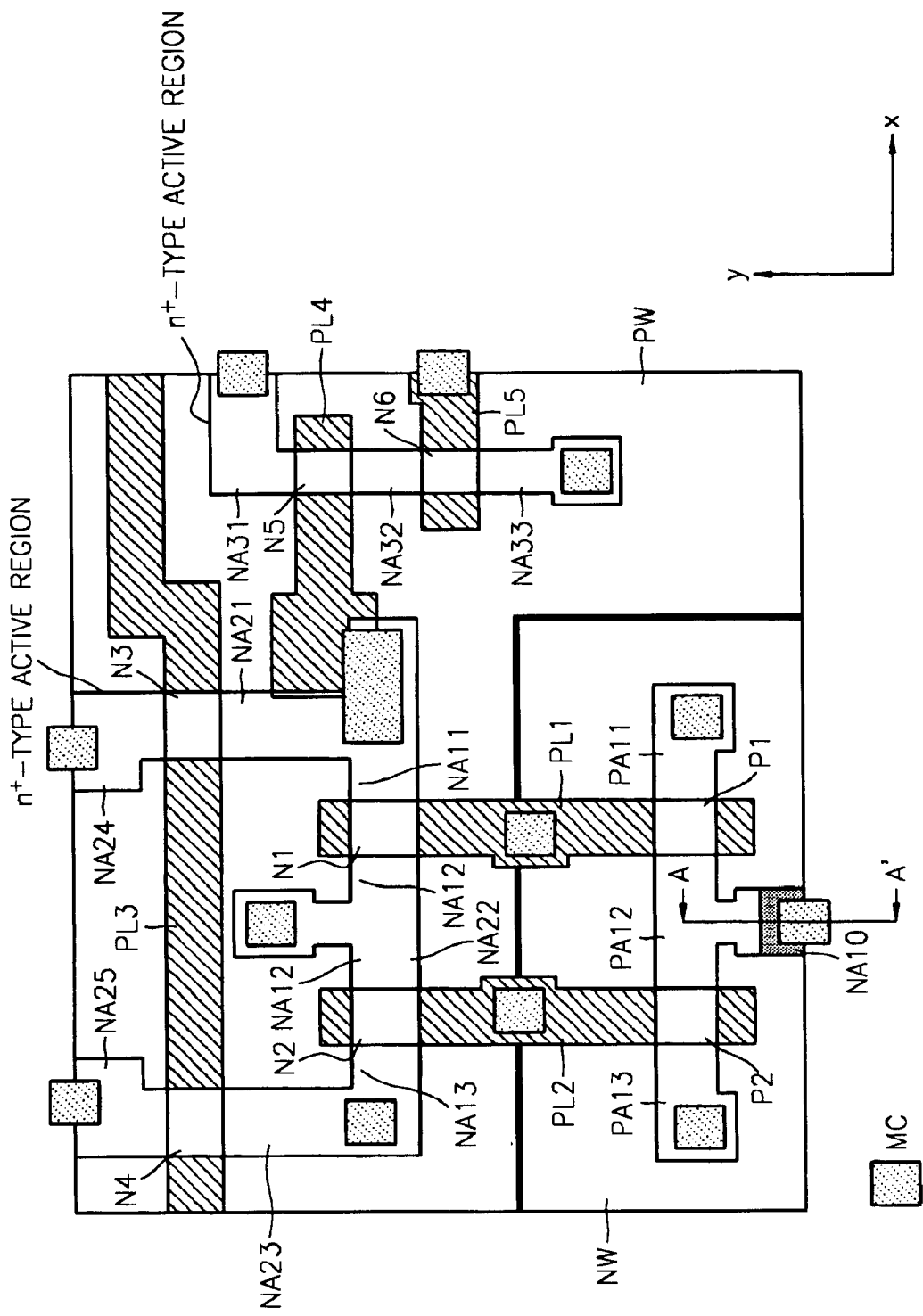
FIG. 4 is a diagram showing a first embodiment of layout of a first layer of the memory cell of the semiconductor memory device, corresponding to the equivalent circuit of FIG. 3.

FIG. 4 shows a first embodiment of a layout of a memory cell of a semiconductor memory device, which includes the equivalent circuit of FIG. 3. The first layout shows the dispositions of a semiconductor substrate, a P-well area PW and an N-well area NW formed on the semiconductor substrate, an n+-type active region and a p+-type active region formed on the P-well PW and the N-well area NW, and a polysilicon wiring layer and a metal contact MC formed on the semiconductor substrate.

More specifically, one P-well area PW and one N-well area NW are formed in the semiconductor substrate. The two PMOS transistors P1 and P2 are formed in the N-well area NW. The six NMOS transistors N1, N2, N3, N4, N5, and N6 are formed in the P-well area PW. Therefore, the P-well area PW is smaller than the N-well area NW.

It is beneficial that the N-well area NW is formed at a corner of the memory cell to reduce the size of the unit memory cell. This formation reduces the isolation area presented by the thick line in FIG. 4, which is formed in a boundary between the P-well area PW and the N-well area PW.

If one N-well area NW and one P-well area are formed, and the N-well area NW is formed at a corner, it is possible to reduce the isolation area formed in the boundary between the N-well area NW and the P-well area PW, and to effectively arrange a wiring line for connecting elements with one another for inputting or outputting data. According to a layout where the N-well area NW is formed at a corner of the memory cell, the size of the unit memory cell can be reduced by approximately 6% compared to the first layout disclosed in U.S. Pat. No. 6,346,062.

Figure 5:
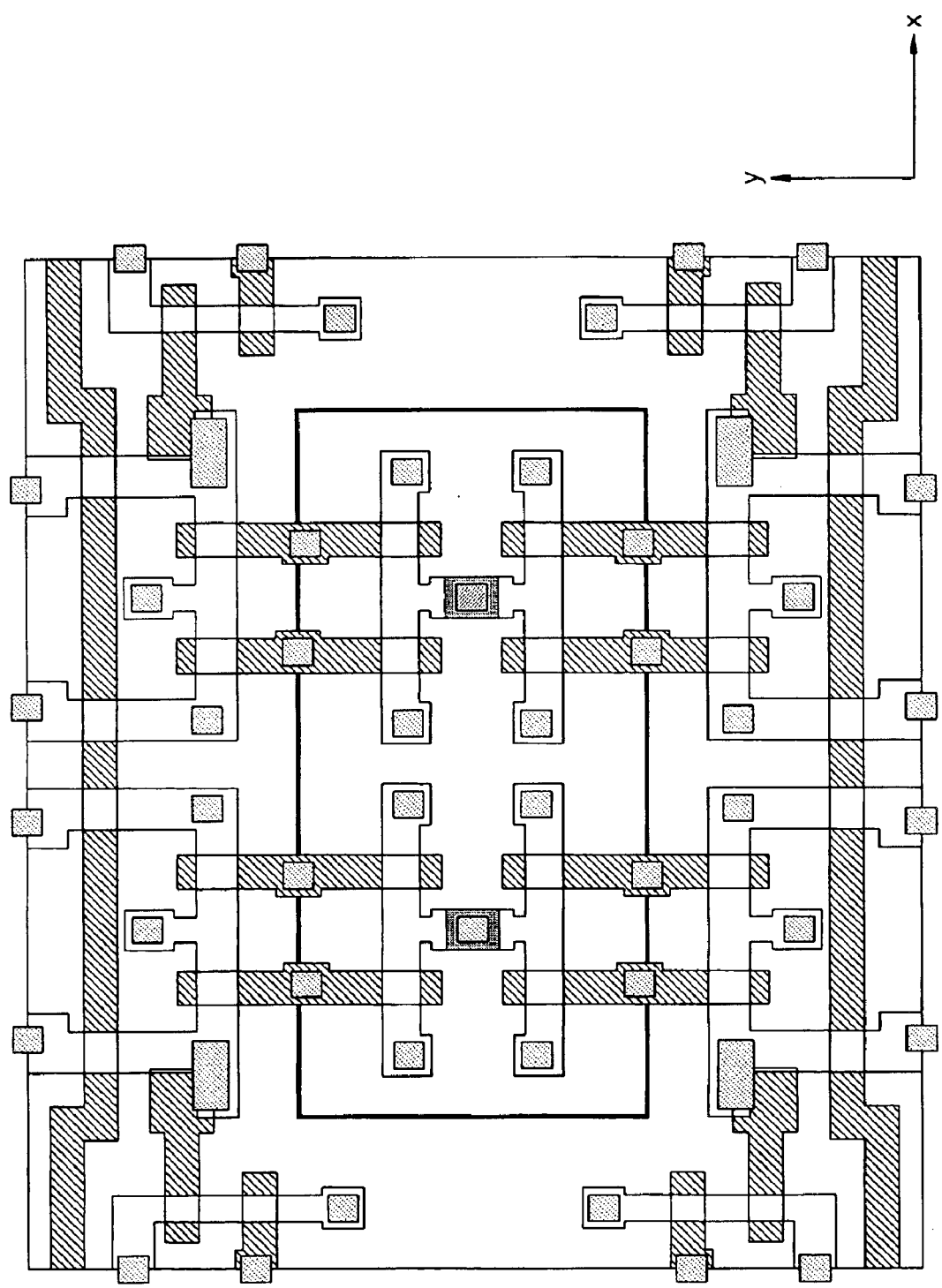
FIG. 5 is a diagram showing a layout of four memory cells of the semiconductor memory device, based on the layout of FIG. 4.

If the N-well area NW is formed at a corner, and two or four memory cells are formed adjacently to one another, it is possible to form one separate N-well area NW for the two or four memory cells by disposing the N-well areas NW of the memory cells adjacent to one another. In addition, it is possible to symmetrically arrange other elements and wiring lines by using relationships between adjacent memory cells. In this case, it is possible to effectively arrange all kinds of wiring lines, including a metal contact MC or a via contact VC. FIG. 5 shows a layout that includes one common N-well area $NW_c$ comprised of four N-well areas NW at each corner.

Referring to FIG. 4, a first polysilicon wiring layer PL1 and a second polysilicon wiring layer PL2 are extended from the N-well area NW to the P-well area PW across the isolation area. Beneficially, the first polysilicon wiring layer PL1 and the second polysilicon wiring layer PL2 are separated by a predetermined width and placed parallel to each other. One end of the first polysilicon wiring layer PL1 and one end of the second polysilicon wiring layer PL2 in the N-well area NW function as gate electrodes of the first PMOS transistor P1 and the second PMOS transistor P2, respectively. The other end of the first polysilicon wiring layer PL1 and the other end of the second polysilicon wiring layer PL2 in the P-well area PW function as gate electrodes of the first NMOS transistor N1 and the second NMOS transistor N2, respectively.

As shown in FIG. 4, if the N-well area NW is formed at one corner of the memory cell in the shape of a rectangle, extending farther along the x-axis than the y-axis, it is beneficial that the first polysilicon wiring layer PL1 and the second polysilicon wiring layer PL2 are formed such that the length along the y-axis is longer than the length along the x-axis. In addition, it is beneficial that the end of the first polysilicon wiring layer PL1 and the end of the second polysilicon wiring layer PL2 in the P-well area PW are formed such that the lengths of the layers along the y-axis does not extend to where the polysilicon wiring layer PL3, the third NMOS transistor N3, and the fourth NMOS transistor N4 are formed.

In FIG. 4, the third polysilicon wiring layer PL3 is formed in the P-well area PW. In the memory cell, the third polysilicon wiring layer PL3 extends from one side of the P-well area PW to the other side of the P-well area PW along the x-axis. This is because the third polysilicon wiring layer PL3 is connected to other third polysilicon wiring layers PL3 of adjacent memory cells along the x-axis. The connection between the third polysilicon wiring layer PL3 connected with other polysilicon wiring layers PL3 forms the first word line WL. The polysilicon wiring layer PL3 also functions as gate electrodes of the third NMOS transistor N3 and the fourth NMOS transistor N4.

A bent portion of the third polysilicon wiring layer PL3 is temporarily formed to allow for the formation of other elements, i.e., the fifth NMOS transistor N5 and the sixth NMOS transistor N6. Thus, the bent portion may not always be formed.

In FIG. 4, a fourth polysilicon wiring layer PL4 and a fifth polysilicon wiring layer PL5, which function as gate electrodes of the fifth NMOS transistor N5 and the sixth NMOS transistor N6, are formed in the P-well area PW. Here, it is beneficial that one side of the fifth polysilicon wiring layer PL5 is disposed in the boundary between the memory cells, for connection to another fifth polysilicon wiring layer of an adjacent memory cell, as shown in FIG. 5. Thus, the metal contact MC connected to the fifth polysilicon wiring layer PL5 is shared by two adjacent memory cells, such that the number of metal contacts MC is reduced.

Hereinafter, n+-type active regions and p+-type active regions will be described.

Referring to FIG. 4, p-type impurity is injected into the N-well area NW at both sides of the first polysilicon wiring layers PL1 to form p+-type active regions PA11 and PA12. Thus, the first PMOS transistor P1 is formed, using the first polysilicon wiring layer PL1 as a gate electrode. The first PMOS transistor P1 has a source region PA12 connected to the metal contact MC for connection to a power source potential Vdd line, and a drain region PA11 connected to another metal contact MC for connection to an upper wiring layer, i.e., the first memory node M1.

P+-type active regions PA12 and PA13 are formed by injecting p-type impurity into the N-well area NW at both sides of the second polysilicon wiring layer PL2. As a result, the second PMOS transistor P2 is formed, using the second polysilicon wiring layer PL2 as a gate electrode. The second PMOS transistor P2 has a source region PA13 connected to a metal contact MC for connection to a power source Vdd and a drain region PA11 connected to another metal contact MC for connection to an upper wiring layer, i.e., the second memory node M2.

Beneficially, the source region PA12 of the first PMOS transistor P1 and the source region PA12 of the second PMOS transistor P2 can share the metal contact MC. Then, the number of metal contacts MC in the unit memory cell can be reduced. In this case, it is beneficial that the n+-type active region has a portion protruding along the y-axis, that is, in the direction opposite of the first polysilicon wiring layer PL1 and the second polysilicon wiring layer PL2. In addition, it is more beneficial that a shared metal contact MC is formed in the n+-type active region.

If the source regions PA12 of the first PMOS transistor P1 and the second PMOS transistor P2 are connected to the shared metal contact MC, it is beneficial that the connection is made in boundaries between memory cells. If so, the source regions of the first PMOS transistor P1 and the second PMOS transistor P2 can be connected with each other through the shared metal contact MC. Thus, it is possible to reduce the number of metal contacts in a semiconductor memory device.

The arrangement previously described forms one common N-well area $NW_c$ by disposing two or four memory cells adjacent to one another. In particular, such an arrangement is useful for the case where the N-well area $NW_c$ is isolated by P-well areas PW surrounding the N-well area $NW_c$. The N-well area $NW_c$ surrounded by the P-well areas PW requires well power supply through a well contact. If the metal contact MC is placed in the boundary between memory cells, as described above, it is possible to supply well power to a common N-well area $NW_c$, i.e., the N-well areas NW of two or four memory cells, simultaneously through the metal contact MC.

When the metal contact MC, which supplies well power to the N-well area NW, is formed, it is beneficial that an N-type impurity is injected into the portion where the metal contact MC is connected to the p+-type active region PA12, to further form the n+-type active region NA10. This is because a portion supplied with well power may form a diode within, and deteriorate electrical characteristics of the semiconductor memory device. That is, beneficially, the n+-type active region NA10 is further formed in the protrusion of the p+-type active region PA12 in the boundary between memory cells, and the metal contact MC is formed on the upper portion of the n+-type active region NA10.

Figure 6:
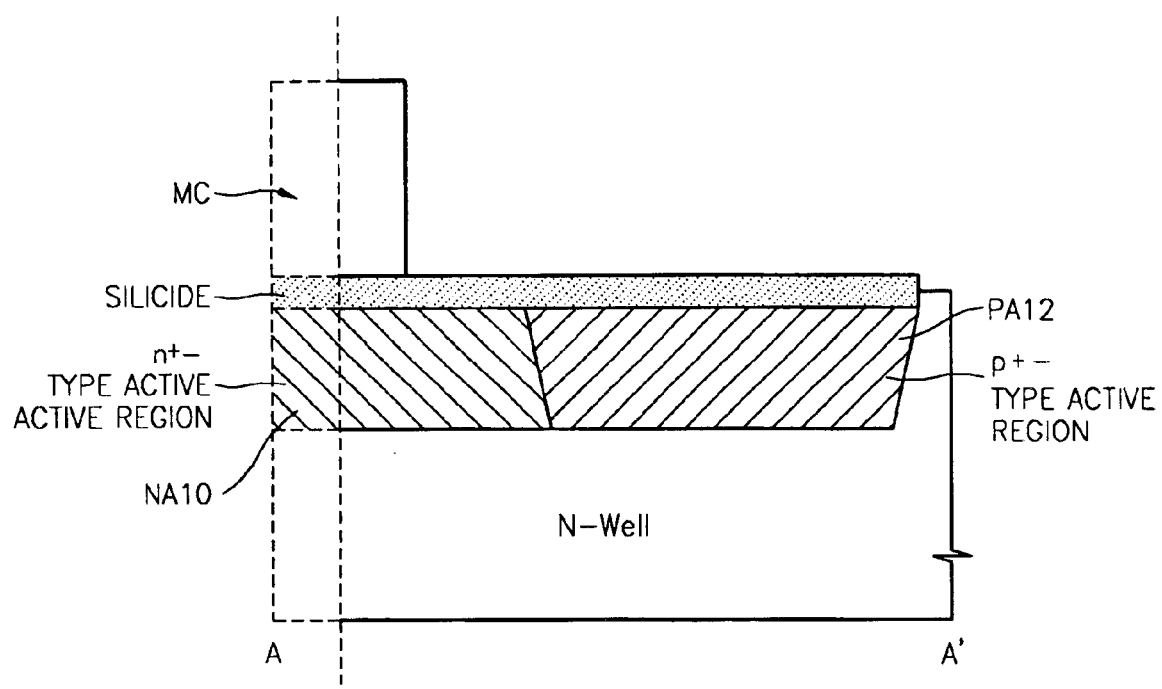
FIG. 6 is a schematic sectional view of the semiconductor memory device taken along the A–A' line of the layout in FIG. 4.

FIG. 6 is a schematic sectional view of line A–A' in FIG. 4. In FIG. 6, a source region of the first PMOS transistor P1 and a source region of the second PMOS transistor P2 are connected. The metal contact MC supplying the well power to the isolated N-well area NW, the n+-type active region NA10, the p+-type active region PA12, and silicide layer connecting the n+-type active region NA10 with the p+-type active region PA12 are connected.

Referring to FIG. 6, the n+-type active region NA10 and the p+-type active region PA12 are formed to supply well power to the N-well area NW of the semiconductor substrate. The silicide layer is formed in upper portions of the n+-type active region NA10 and the p+-type active region PA12. If current supplied through the metal contact MC, flows into the silicide layer, it is possible to provide a power source to the p+-type active region PA12, as well as the n+-type active region NA10, through one metal contact.

As described above, since the power source potential Vdd line connected to source regions of transistors, and the well power line, supplying the well power to the isolated well area, share one metal contact, it is not necessary to additionally form another metal contact connected to the well power line. Therefore, it is possible to prevent the size of the unit memory cell from increasing due to any additional formation of metal contacts.

Figure 7:
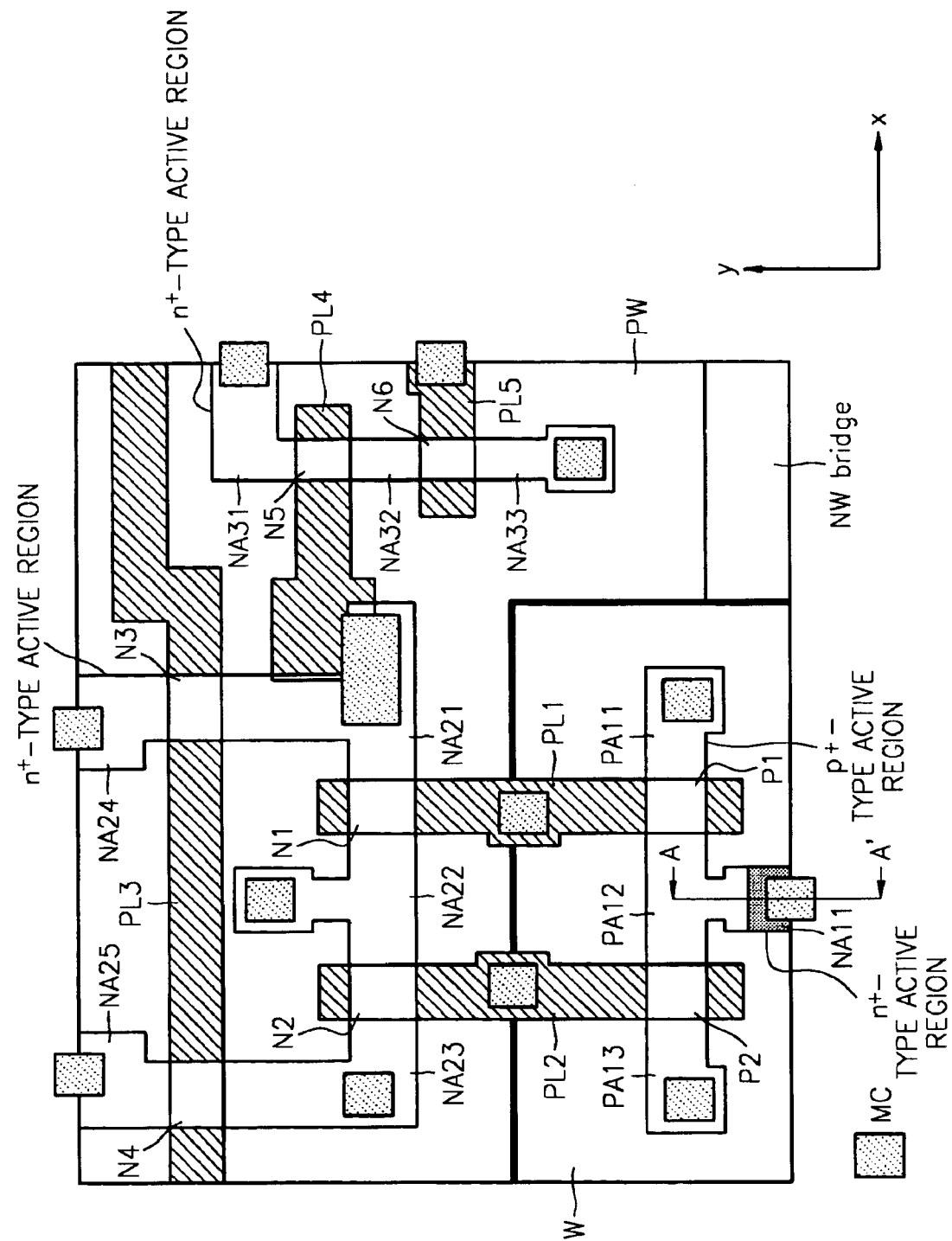
FIG. 7 is a diagram showing a second embodiment of a layout of a first layer of a memory cell of a semiconductor memory device corresponding to the equivalent circuit of FIG. 3, according to another embodiment.

FIG. 7 shows a layout of a memory cell of a semiconductor memory device, according to another embodiment. Referring to FIG. 7, an N-well area NW bridge is added to the layout of FIG. 4. The NW bridge is formed by injecting the N-type impurity into the P-well area PW. Here, it is beneficial that the NW bridge is formed in the P-well area PW between the boundary of the N-well area NW and the P-well area PW and the boundary of other memory cells.

As described above, if the NW bridge is added to each memory cell, it is possible to supply well power to the isolated N-well area NW without using the well contact. That is, it is possible to supply the power to the isolated N-well area NW from outside the cell array, using the N-well area NW bridge. However, if only the N-well area NW bridge is formed, without forming the well contact, it is difficult to provide the isolated N-well area NW with enough power from the power source, because the resistance of the NW bridge is great. Therefore, it is beneficial that the formation of the NW bridge is extended in a structure where the well contact is also formed.

Referring to FIG. 4, the n+-type active regions NA11 and NA12 are formed by injecting n-type impurity into the P-well area PW at both sides of a first polysilicon wiring layer PL1. As a result, a first NMOS transistor N1 is formed, which uses the first polysilicon wiring layer PL1 as a gate electrode.

Then, n+-type active regions NA12 and NA13 are formed by injecting n-type impurity into the N-well area NW at both sides of a second polysilicon wiring layer PL2. As a result, a second NMOS transistor N2 is formed, which uses the second polysilicon wiring layer PL2 as a gate electrode.

It is beneficial that the n+-type active region NA22, formed between the first polysilicon wiring layer PL1 and the second polysilicon wiring layer PL2, develops a protrusion. Thus, it is possible to effectively connect the protrusion of the n+-type active region NA22, i.e. source regions of the first NMOS transistor N1 and the second NMOS transistor N2, to the ground line through the metal contact MC. In addition, the first NMOS transistor N1 and the second NMOS transistor N2 share the metal contact MC so that the total number of metal contacts MC in the unit memory cell is reduced.

Referring to FIG. 4, n+-type regions NA21, NA23, NA24, and NA25 are formed by injecting n-type impurity into the P-well area PW at both sides of the third polysilicon wiring layer PL3. As a result, a third NMOS transistor N3 is formed, which uses the third polysilicon wiring layer PL3 as a gate electrode. The third NMOS transistor N3 has a source region NA21 connected to the drain region of the first NMOS transistor N1 and a drain region NA24 connected to an upper wiring layer through the metal contact MC. It is beneficial that the metal contact MC is formed in boundaries between memory cells, so that memory cells adjacent to one another can share the metal contact MC.

A fourth NMOS transistor N4 is formed, which also uses the third polysilicon wiring layer PL3 as a gate electrode. The fourth NMSO transistor N4 has a source region NA23 connected to the drain region of the second NMOS transistor N2 and a drain region NA25 connected to the upper wiring layer through another metal contact MC. It is beneficial that the metal contact MC is formed in boundaries between memory cells, so that memory cells adjacent to one another can share the metal contact MC.

Therefore, the first NMOS transistor N1 is connected in series to the third NMOS transistor N3. If the first polysilicon wiring layer PL1 and the third polysilicon wiring layer PL3 are disposed at right angles to each other, the n+-type active region NA21 may be bent. The n+-type active region NA21 is located where the drain region of the first NMOS transistor N1 and the source region of the third NMOS transistor N3 are connected. Here, the n+-type region NA21 corresponds to the first memory node M1. The n+-type active region NA21 is connected to the upper wiring layer through the metal contact MC.

Likewise, the second NMOS transistor N2 and the fourth NMSO transistor N4 are connected in series. If the second polysilicon wiring layer PL2 and the third polysilicon wiring layer PL3 are disposed at right angles, the n+-type active region NA23 may be bent. The n+-type active region NA23 is located where the drain region of the second NMOS transistor N2 and the source region of the fourth NMOS transistor N4 are connected. Here, the n+-type active region NA23 corresponds to the second memory node M2. The n+-type active region NA23 is connected to the upper wiring layer through another metal contact MC.

It is beneficial that one end of the fourth polysilicon wiring layer PL4 overlaps a part of the n+-type active region NA21. In this case, by using the metal contact MC that connects the first memory node M1 to the upper wiring layer ML1 2 of FIG. 8, it is also possible to electrically connect the fourth polysilicon wiring layer PL4, which is used as a gate electrode for the fifth NMOS transistor N5, to the first memory node M1.

Referring to FIG. 4, n+-type active regions NA31 and NA32 are formed by injecting n-type impurity into the P-well area PW at both sides of the fourth polysilicon wiring layer PL4. As a result, a fifth NMOS transistor N5 is formed, which uses the fourth polysilicon wiring layer PL4 as a gate electrode, the n+-type active region NA32 as a drain region, and the n+-type active region NA31 as a source region. The source region NA31 of the fifth NMOS transistor N5 is connected to the upper wiring layer, i.e., to ground, through the metal contact MC. It is beneficial that the metal contact MC is formed in the boundary between memory cells, for sharing by memory cells adjacent to one another.

N+-type active regions NA32 and NA33 are formed by injecting n-type impurity into the P-well area PW at both sides of the fifth polysilicon wiring layer PL5. As a result, a sixth NMOS transistor N6 is formed, which uses the fifth polysilicon wiring layer PL5 as a gate electrode, the n+-type active region NA33 as a source region, and the n+-type active region NA32 as a drain region. The source region NA33 is connected to the upper wiring layer, i.e., a second bit line, through another metal contact MC.

The polysilicon wiring layers PL1, PL2, PL3, PL4, and PL5 are connected to the upper wiring layer through other metal contacts MC. Third polysilicon wiring layer PL3 is connected to the upper wiring layer through a metal contact that is not shown. This is because the third polysilicon wiring layer PL3 is connected to another third polysilicon wiring layer of an adjacent memory cell along the x-axis.

Figure 8:
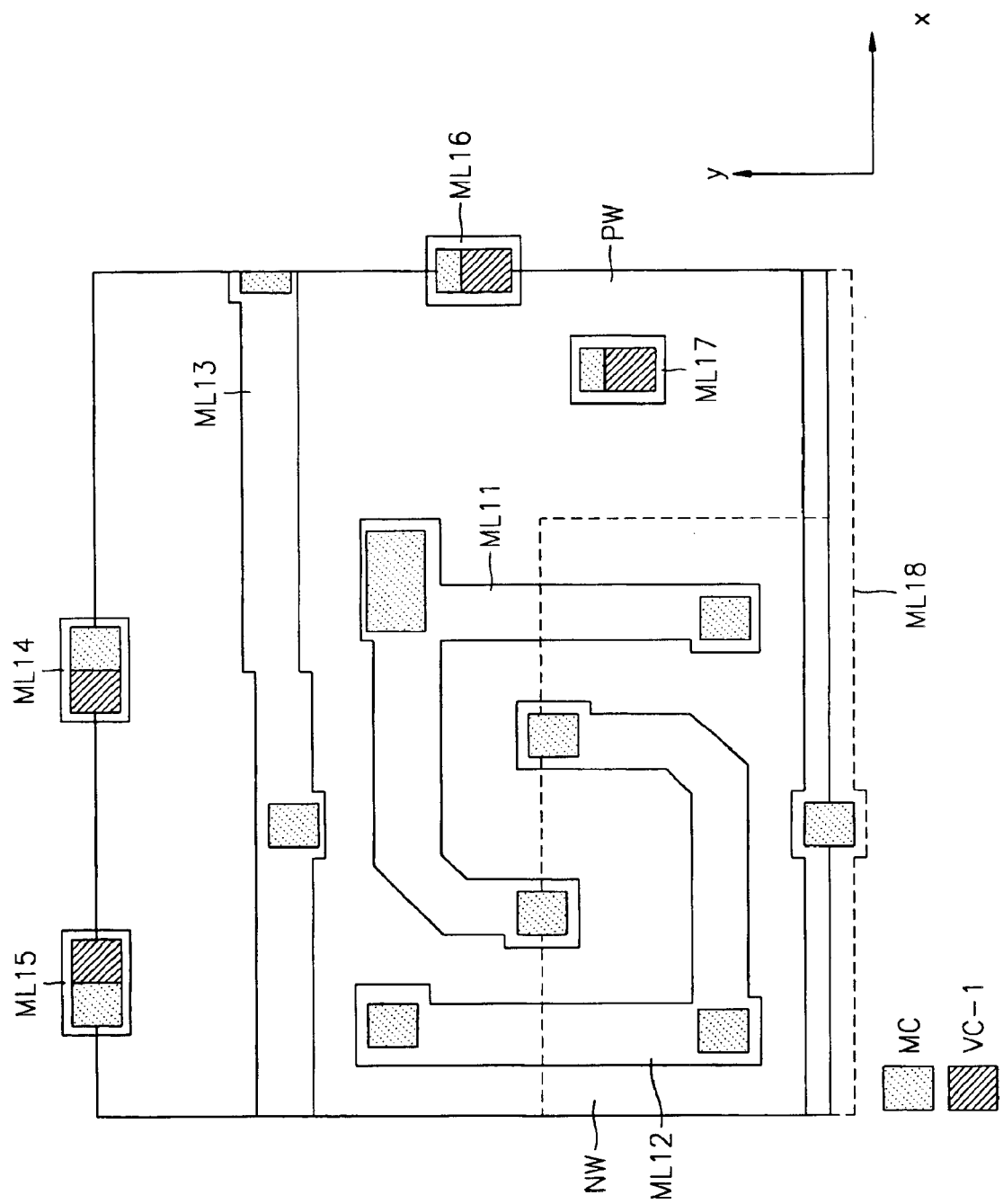
FIG. 8 is a diagram showing a layout of a second layer (first metal layer) of a memory cell of the semiconductor memory device, corresponding to the equivalent circuit of FIG. 3.

Hereinafter, a layout of a semiconductor memory device on an upper portion of FIG. 4 will be described. FIG. 8 shows the layout of the semiconductor memory device on the upper portion of FIG. 4. The dotted lines of FIG. 8 indicate the boundary between the N-well area NW and the P-well area PW, i.e., the isolation area.

FIG. 8 shows a first metal layer ML11 on an upper portion of the layer in FIG. 4. In the first metal layer ML11, conductive materials electrically connected to the first memory node M1 are also electrically connected to one another, the conductive materials including the metal contact MC connected to the drain PA11 of the first PMOS transistor P1; the metal contact MC connected to the drain of the first NMOS transistor N1, the source NA21 of the third NMOS transistor N3 and the fourth polysilicon wiring layer PL4; and the metal contact MC connected to the second polysilicon wiring layer PL2 that is used as the gate electrode of the second PMOS transistor P2 and the second NMOS transistor N2.

As shown in the equivalent circuit of FIG. 3, the drain of the first NMOS transistor N1, the source of the third NMOS transistor N3, the drain of the first PMOS transistor P1, and an input node of the second CMOS inverter are electrically connected with one another.

A first metal layer ML12 is formed in the same layer. In the first metal layer ML12, conductive materials electrically connected to the second memory node M2 are also electrically connected to one another, the conductive materials including the metal contact MC connected to the drain PA13 of the second PMOS transistor P2; the metal contact MC connected to the drain of the second NMOS transistor N2 and the source NA23 of the fourth NMOS transistor N4, and the metal contact MC connected to the first polysilicon wiring layer PL1 that is used as the gate electrode of the first PMOS transistor P1 and the first NMOS transistor N1.

As shown in the equivalent circuit of FIG. 3, the drain of the second NMOS transistor N2, the source of the fourth NMOS transistor N4, the drain of the second PMOS transistor, and the input terminal of the first CMOS inverter are electrically connected to one another through the first metal layer ML12.

A first metal layer M13 is formed and connects the metal contacts MC with one another thereby applying a ground potential VSS to an n+-type extension region NA22, and an n+-type extension region NA31. That is, the first metal layer M13 functions as a ground potential VSS line, thus the source NA22 of the first and the second NMOS transistors N1 and N2 and the source NA31 of the fifth NMOS transistor N5 enter a ground state.

In addition, first metal layers M14, M15, M16, and M17 are formed, and electrically connected to a second metal wiring layer and a third metal wiring layer on the upper portion of the layout in FIG. 8.

A first metal layer M18 is additionally formed for applying a power source potential Vdd to the n+-type active region NA11, which is formed to supply well power through a metal contact MC to a p+-type active region P12 in the N-well area N2 through the metal contact MC. That is, the first metal layer M18 functions as a power source potential Vdd line, thus enabling electrical connection from the source PA12 of the first PMOS transistor P1 and the source PA12 of the second PMOS transistor P1 to the power source. Even when the N-well area NW is isolated, the first metal layer M18 is electrically connected to the N-well area NW through the metal contact MC, which functions as the well contact.

The first metal layers M13 and M18 respectively, function as the ground potential VSS line and the power source potential Vdd line, and extend along the x-axis. When one separate N-well area is formed in the N-well areas NW out of two or four memory cells adjacent to one another, it is beneficial that the first metal layer M18, i.e., the power source potential Vdd line, is formed in the boundary between the memory cells.

Figure 9:
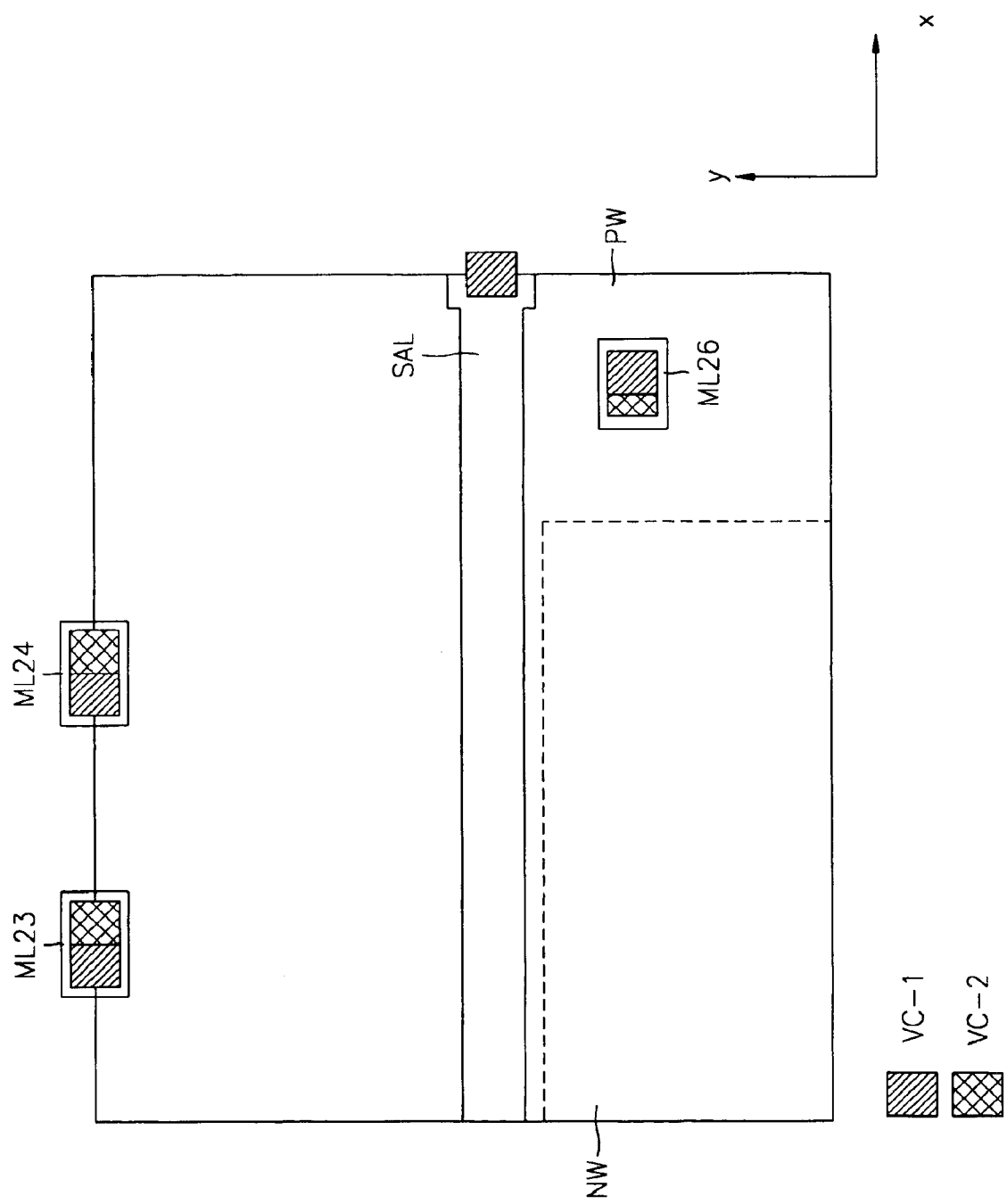
FIG. 9 is a diagram showing a layout of a third layer (second metal layer) of a memory cell of the semiconductor memory device, corresponding to the equivalent circuit of FIG. 3.

Hereinafter, the layout of the semiconductor memory device on the upper portion of FIG. 8 will be described. FIG. 9 shows the layout of the semiconductor memory device on the upper portion of FIG. 8. The dotted lines of FIG. 9 indicate the boundary of the N-well area NW and the P-well area PW, i.e., an isolated area.

FIG. 9 shows a second metal layer on the upper portion of FIG. 8. Referring to FIG. 9, a second word line, i.e., a scan address line SAL, is formed parallel to the x-axis and is electrically connected to the fifth polysilicon wiring layer PL5. To establish connection with the fifth polysilicon wiring layer PL5, the second word line is connected to the via contact VC1 in the boundary between memory cells, and the via contact VC1 is connected to the metal contact MC, which is connected to the fifth polysilicon wiring layer PL5, as shown in FIGS. 7 and 8. It is beneficial that the second word line SAL is formed parallel to the first word line, i.e. the third polysilicon wiring layer PL3 of FIG. 4.

Second metal layers ML23, ML24, and ML26 are formed and used to connect the first via contact VC1 to a second via contact VC2 for connection to the metal layers on the upper portion of the layers in FIG. 9.

Figure 10:
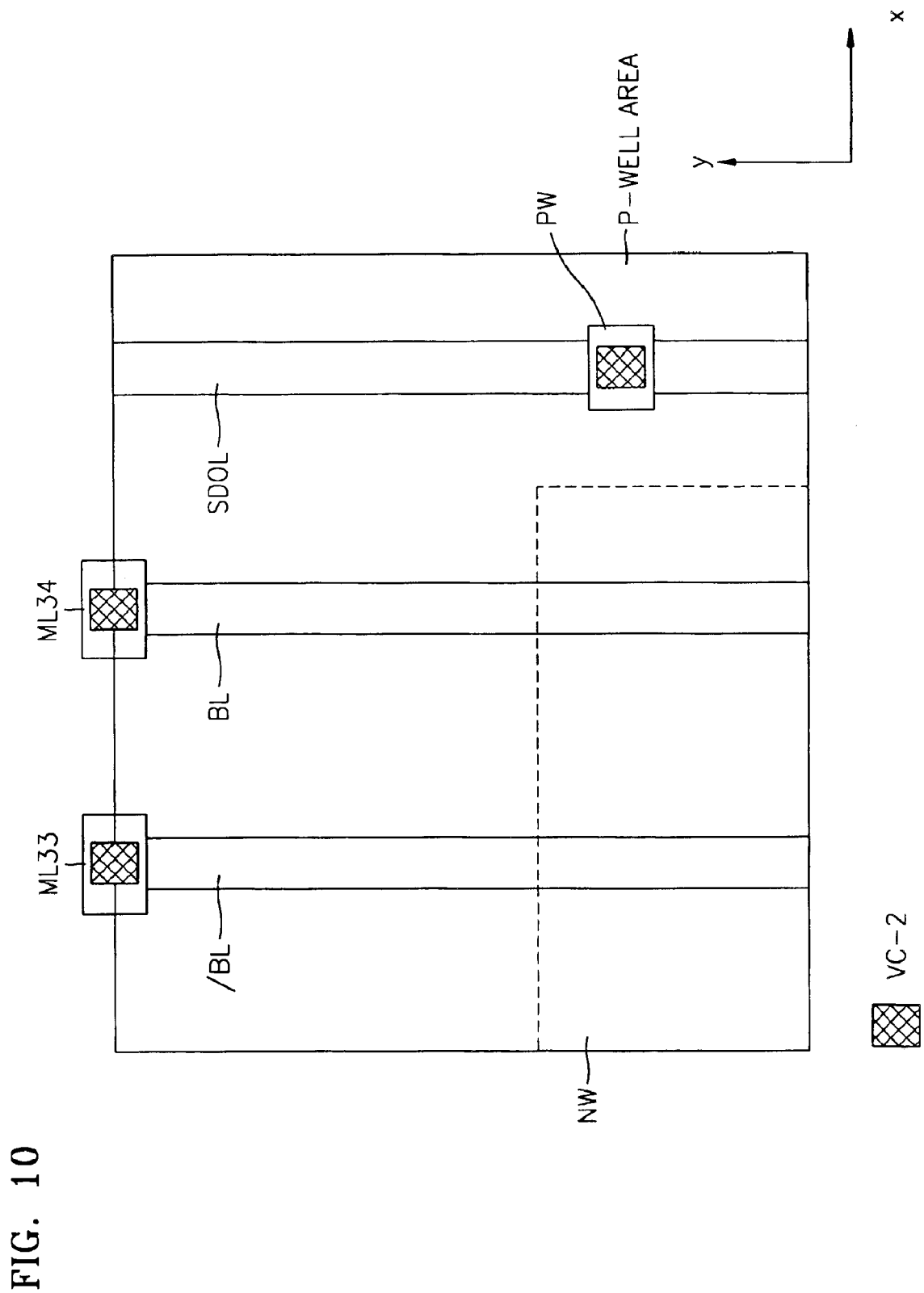
FIG. 10 is a diagram showing a layout of a fourth layer (third metal layer) of a memory cell of the semiconductor memory device, corresponding to the equivalent circuit of FIG. 3.

Hereinafter, a layout of the semiconductor memory device on the upper portion of FIG. 9 will be described. FIG. 10 shows the layout of the semiconductor memory device on the upper portion of FIG. 9. The dotted lines of FIG. 10 indicate the boundary between the N-well area and the P-well area, i.e., an isolated area.

FIG. 10 shows a third metal layer on the upper portion of the layer in FIG. 9. A first bit line BL and a first complementary bit line/BL are formed parallel to each other along the y-axis, from one end of the memory cell to the other end of the memory cell. Typically, the first bit line BL and the first complementary bit line/BL are formed at a right angle to the first word line.

The first bit line BL and the first complementary bit line/BL are connected to the second via contact VC2 at one end of the memory cell and form third metal layers ML34 and ML33. As a result, the first bit line BL is connected to the second via contact VC2 in the third metal layer ML34, as shown in FIG. 10, the second via contact VC2 is connected to the first via contact VC1 in the second metal layer ML24 as shown in FIG. 9, and the first via contact VC1 is connected to the metal contact MC in the first metal layer ML14 as shown in FIG. 8. The metal contact MC is connected to the drain of the third NMOS transistor N3, as shown in FIG. 4. Thus the first bit line BL is electrically connected to the drain of the third NMOS transistor N3.

The first complementary bit line/BL is connected to the second via contact VC2 in the third metal layer ML33 as shown in FIG. 10, the second via contact VC2 is connected to the first via contact VC1 in the second metal layer ML23 as shown in FIG. 9, and the first via contact VC1 is connected to the metal contact MC in the first metal layer ML15 as shown in FIG. 8. The metal contact MC is connected to the drain of the fourth NMOS transistor N4, as shown in FIG. 4. Thus the first complementary bit line/BL is electrically connected to the drain of the fourth NMOS transistor N4.

Referring to FIG. 10, a second bit line, i.e., a scan data out line SDOL, is formed along the y-axis from one end of the memory cell to the other end of the memory cell. It is beneficial that the second bit line SDOL is formed parallel to the first bit line BL.

The second bit line SDOL is connected to the second via contact VC2 in an area of the memory cell, forming a third metal layer ML36. As a result, the second bit line SDOL is connected to the second via contact VC2 in the third metal layer ML36 as shown in FIG. 10, the second via contact VC2 is connected to the first via contact VC1 in the second metal layer ML26 as shown in FIG. 9, and the first via contact VC1 is connected to the metal contact in the first metal layer ML17 as shown in FIG. 8. The metal contact MC is connected to the drain of the sixth NMOS transistor N6 as shown in FIG. 4. Thus the second bit line SDOL is electrically connected to the drain of the sixth NMOS transistor N6.

It is beneficial that the first bit line BL, the first complementary bit line/BL, and the second bit line SDOL are formed parallel to one another from one end of the memory cell to other end of the memory cell. As a result, the drain regions of the third NMOS transistors N3 formed in different memory cells are connected with one another through the first bit line BL, the drain regions of the fourth NMOS transistors N4 formed in different memory cells are connected with one another through the first complementary bit line/BL, and the drain regions of the sixth NMOS transistors N6 formed in different memory cells are connected with one another through the second bit line SDOL.

Figure 11:
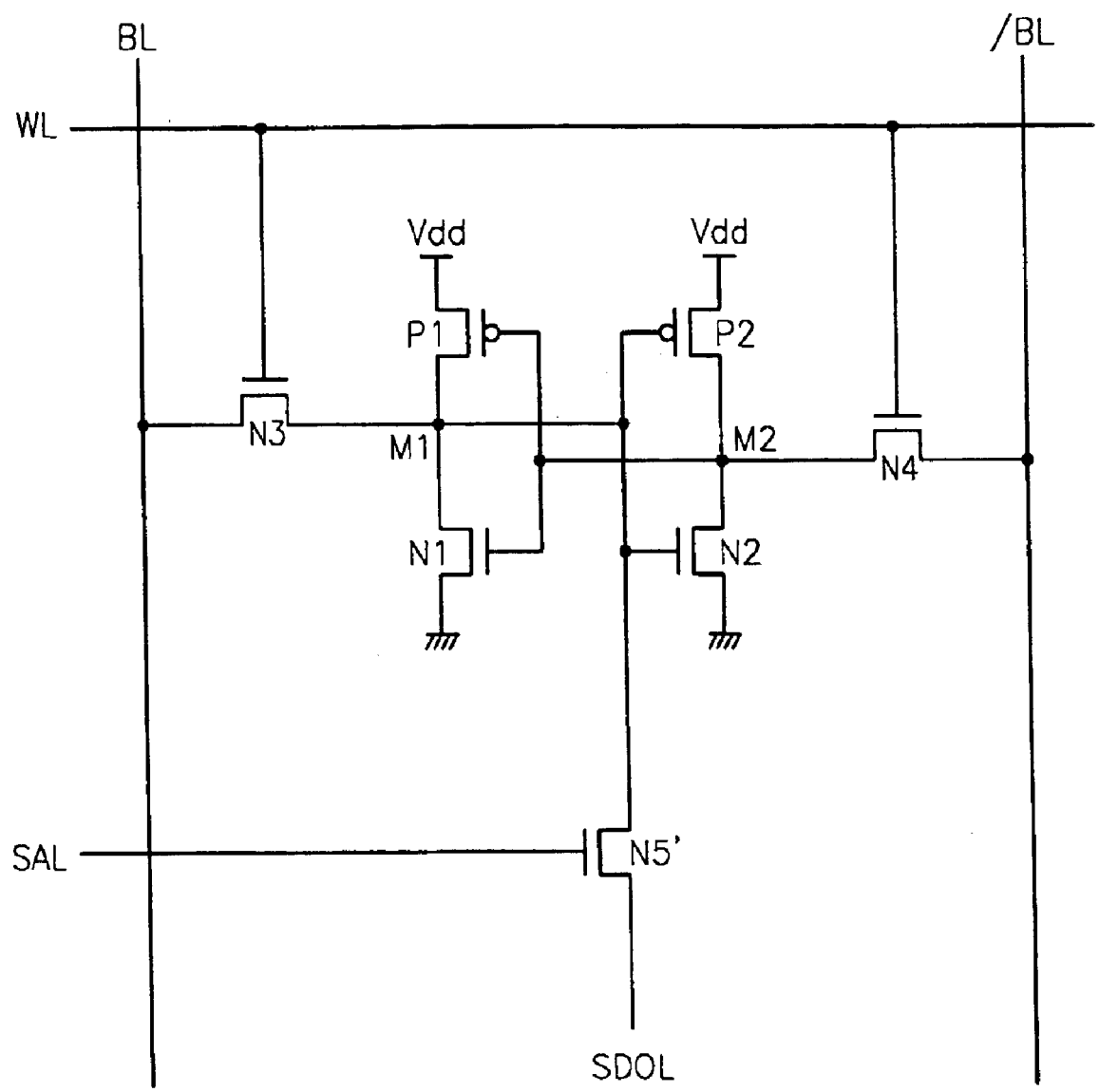
FIG. 11 is a diagram showing an equivalent circuit of a dual-port semiconductor memory device according to another embodiment.

Hereinafter, a dual-port semiconductor memory device according to a second embodiment will be described. FIG. 11 shows an equivalent circuit of the dual-port semiconductor memory device according to the second embodiment. The equivalent circuit of FIG. 11 includes a total of seven MOS transistors, in contrast to the equivalent circuit of FIG. 3, which includes eight MOS transistors. Like reference numerals are used for elements which are identical to those of FIG. 3.

Referring to FIG. 11, the first PMOS transistor P1 and the first NMOS transistor N1 constitute the first CMOS inverter. The second PMOS transistor P2 and the second NMOS transistor N2 constitute the second CMOS inverter. Output ends and input terminals of the CMOS inverters are cross connected. Thus, the MOS transistors P1, P2, N1, and N2 constitute a flip-flop circuit. According to the equivalent circuit of FIG. 11, data can be read from or written to a first memory node M1, which functions as an output terminal of the first CMOS inverter, and as an input terminal of the second CMOS inverter and a second memory node M2, which functions as an output terminal of the second CMOS inverter and as an input terminal of the first CMOS inverter.

The third NMOS transistor N3 and the fourth NMOS transistor N4 are pass transistors, that is, they function as access transistors for the first memory node M1 and the second memory node M2. The third NMOS transistor N3 has a gate connected to the first word line WL, a source connected to the first memory node N1, and a drain connected to the first bit line BL. The fourth NMOS transistor N4 has a gate connected to the first word line WL, a source connected to the second memory node N2, and a drain connected to the first complementary bit line/BL .

A fifth NMOS transistor N5' is added to a single-port transistor to achieve the dual-port semiconductor memory device. That is, since the fifth NMOS transistor N5, has a source connected to the first memory node M1, it is possible to read data stored in the first memory node M1 by operating the fifth NMOS transistor N5'. The fifth NMOS transistor N5' has a gate connected to the second word line SAL and a drain connected to the second bit line SDOL.

According to the equivalent circuit described above, data can be read from or written to the memory nodes M1 and M2 by selecting the first word line WL, the first bit line BL, and the first complementary bit line/BL, which functions as a first port. It is also possible to read data from the first memory node M1 by selecting the second word line SAL and the second bit line SDOL, which functions as a second bit line. In a semiconductor memory device having such an equivalent circuit, it is possible to read data through the second port independent from operations of the first port, without changing the status of the memory nodes M1 and M2.

Such an equivalent circuit has been widely used. However, unlike the prior art layout of FIG. 2, the memory cell is now divided into one N-well area NW and one P-well area PW, as shown above with respect to the first embodiment. This is in contrast to the prior art where the memory cell is divided into three well areas, i.e., a first P-well area PW1, an N-well area NW, and a second P-well area PW2, in this case only one N-well area NW and one P-well area PW are used for a memory cell. In addition, the detailed arrangement of the well areas can vary in the present invention.

For example, the first PMOS transistor P1 and the second PMOS transistor P2 of FIG. 11 are formed in the N-well area NW as shown in FIG. 4. Meanwhile, the first NMOS transistor N1, the second NMOS transistor N2, the third NMOS transistor N3, the fourth NMOS transistor N4, and the fifth NMOS transistor N5' of FIG. 11 are formed in the P-well area PW. However, the fifth NMOS transistor N5' has the same function as the fifth NMOS transistor N5 and the sixth NMOS transistor N6 of the first embodiment shown in FIG. 3.

Because NMOS transistor N5' in FIG. 11 replaces NMOS transistors N5 and N6 of FIG. 3, appropriate minor modifications to the layouts of FIGS. 4–10 are of course made without departing from the principles set forth above.

Accordingly, a dual-port semiconductor memory device can be achieved in a memory cell that includes one N-well area NW and one P-well area PW. This illustrates a reduction in the size of well areas, compared to the case of the memory cell that includes one N-well area NW and two P-well areas PW at both sides of the N-well area NW. It is also possible to reduce the size of the isolated area that is formed in the area where different well areas contact. Since the size of the isolated area is reduced, the size of a unit memory cell can be reduced accordingly.

Reduction in the size of the unit memory cell is beneficial for integrity improvements of a semiconductor memory device. In addition, a reduction in the length of a wiring layer, which is used to connect elements of the unit memory cell, can be achieved. Therefore, the semiconductor memory device can achieve high-speed processing and reduced power consumption.

Moreover, even when the N-well area NW is surrounded by the P-well area PW and isolated, it is not necessary to additionally form a well contact. That is, since the n+-type active region is formed by injecting n+-type impurity in the formation area of the metal contact and the metal contact is connected to the power source potential line, the power source potential line can also function as the well power line by connecting the n+-type active region with the p+-type active region through a silicide layer. Therefore, when the well contact is formed, it is possible to prevent the size of the unit memory cell from increasing.

If not enough well power is accumulated in the well areas when sharing the metal contact, it is possible to add an N-well bridge to an area of the P-well area PW and connect the isolated N-well areas with one another, allowing the supply of well power through the N-well bridge.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A dual-port semiconductor memory device comprising:
   a semiconductor substrate, which includes a memory cell having one N-well area where a p+-type active region is formed and one contiguous P-well area where an n+-type active region is formed;
   a first word line;
   a second word line (scan address line);
   a first bit line;
   a first complementary bit line;
   a second bit line (scan data out line);
   a first CMOS inverter, which includes a first NMOS transistor, a first PMOS transistor, an input terminal, and an output terminal;
   a second CMOS inverter, which includes a second NMOS transistor, a second PMOS transistor, an input terminal, and an output terminal, wherein the input terminal of the second CMOS inverter is connected to the output terminal of the first CMOS inverter to form a first memory node and the output terminal of the second CMOS inverter is connected to the input terminal of the first CMOS inverter to form a second memory node;
   a third NMOS transistor, which has a gate connected to the first word line, a drain connected to the first bit line, and a source connected to the first memory node;
   a fourth NMOS transistor, which has a gate connected to the first word line, a drain connected to the first complementary bit line, and a source connected to the second memory node;
   a fifth NMOS transistor, which has a gate connected to the first memory node and a source connected to a ground line; and
   a sixth NMOS transistor, which has a gate connected to the second word line, a source connected to the drain of the fifth NMOS transistor, and a drain connected to the second bit line,
   wherein the first PMOS transistor and the second PMOS transistor are disposed in the p+-type active region of the N-well area; and the first NMOS transistor, the second NMOS transistor, the third NMOS transistor, the fourth NMOS transistor, the fifth NMOS transistor, and the sixth NMOS transistor are formed in the n+-type active region of the contiguous P-well area.

2. The dual-port semiconductor memory device of claim 1, wherein the N-well area is disposed at a corner of the memory cell, and the contiguous P-well area is disposed in a remaining portion of the memory cell.

3. The dual-port semiconductor memory device of claim 2, wherein a plurality of N-well areas constitute a common N-well area which is surrounded by the contiguous P-well area, and the dual-port semiconductor memory device further comprises a well contact used to connect the one common N-well area with a power source of the semiconductor memory device.

4. The dual-port semiconductor memory device of claim 3, wherein a second n+-type active region, which is connected to the well contact, is further formed in the p+-type active region of the common N-well area, and a silicide layer is formed in the second n+-type active region and the p+-type active region to connect the second n+-type active region and the p+-type active region to each other.

5. The dual-port semiconductor memory device of claim 3, wherein the common N-well area is shared by four memory cells.

6. The dual-port semiconductor memory device of claim 5, wherein the n+-type active region and the well contact in the p+-type active region are shared by two memory cells adjacent to each other.

7. The dual-port semiconductor memory device of claim 1, wherein an N-well bridge is further formed in the contiguous P-well area to connect N-well areas of memory cells that are adjacent to each other.

8. The dual-port semiconductor memory device of claim 7, wherein a width of the N-well bridge is 10% to 50% of a width of the N-well area.

9. The dual-port semiconductor memory device of claim 1, wherein the second word line is parallel to the first word line.

10. The dual-port semiconductor memory device of claim 1, wherein the second bit line is parallel to the first bit line.

11. A dual-port semiconductor memory device comprising:

a semiconductor substrate, which includes a memory cell having one N-well area where a p+-type active region is formed and one contiguous P-well area where an n+-type active region is formed;

a first word line;

a second word line (scan address line);

a first bit line;

a first complementary bit line;

a second bit line (scan data out line);

a first CMOS inverter, which includes a first NMOS transistor, a first PMOS transistor, an input terminal, and an output terminal;

a second CMOS inverter, which includes a second NMOS transistor, a second PMOS transistor, an input terminal, and an output terminal, wherein the input terminal of the second CMOS inverter is connected to the output terminal of the first CMOS inverter to form a first memory node and the output terminal of the second CMOS inverter is connected to the input terminal of the first CMOS inverter to form a second memory node;

a third NMOS transistor, which has a gate connected to the first word line, a drain connected to the first bit line, and a source connected to the first memory node;

a fourth NMOS transistor, which has a gate connected to the first word line, a drain connected to the first complementary bit line, and a source connected to the second memory node; and a fifth NMOS transistor, which has a gate connected to the second word line, a source connected to the first memory node, and a drain connected to the second bit line, wherein the first PMOS transistor and the second PMOS transistor are disposed in the p+-type active region of the N-well area; and the first NMOS transistor, the second NMOS transistor, the third NMOS transistor, the fourth NMOS transistor, and the fifth NMOS transistor are formed in the n+-type active region of the contiguous P-well area.

12. The dual-port semiconductor memory device of claim 11, wherein the N-well area is disposed at a corner of the memory cell, and the contiguous P-well area is disposed in a remaining portion of the memory cell.

13. The dual-port semiconductor memory device of claim 12, wherein a plurality of N-well areas constitute a common N-well area, which is surrounded by the contiguous P-well area, and the dual-port semiconductor memory device further comprises a well contact used to connect the one common N-well area with a power source of the semiconductor memory device.

14. The dual-port semiconductor memory device of claim 13, wherein a second n+-type active region, which is connected to the well contact, is further formed in the p+-type active region of the common N-well area, and a silicide layer is formed in the second n+-type active region and the p+-type active region to connect the second n+-type active region and the p+-type active region to each other.

15. The dual-port semiconductor memory device of claim 13, wherein the one common N-well area is shared by four memory cells.

16. The dual-port semiconductor memory device of claim 15, wherein the n+-type active region and the well contact in the p+-type active region are shared by two memory cells adjacent to each other.

17. The dual-port semiconductor memory device of claim 11, wherein an N-well bridge is further formed in the contiguous P-well area to connect the N-well areas of the memory cells adjacent to each other.

18. The dual-port semiconductor memory device of claim 17, wherein a width of the N-well bridge is 10% to 50% of a width of the N-well area.

19. The dual-port semiconductor memory device of claim 11, wherein the second word line is parallel to the first word line.

20. The dual-port semiconductor memory device of claim 11, wherein the second bit line is parallel to the first bit line.

* * * * *